(12) United States Patent
Huang

(10) Patent No.: US 11,943,910 B2
(45) Date of Patent: Mar. 26, 2024

(54) SEMICONDUCTOR DEVICE AND MANUFACTURING METHOD THEREOF

(71) Applicant: NANYA TECHNOLOGY CORPORATION, New Taipei (TW)

(72) Inventor: Chung-Lin Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 192 days.

(21) Appl. No.: 17/646,482

(22) Filed: Dec. 30, 2021

(65) Prior Publication Data
US 2023/0217642 A1    Jul. 6, 2023

(51) Int. Cl.
*H10B 12/00*    (2023.01)
(52) U.S. Cl.
CPC ........... *H10B 12/053* (2023.02); *H10B 12/34* (2023.02)

(58) Field of Classification Search
None
See application file for complete search history.

(56) References Cited

U.S. PATENT DOCUMENTS

| | | | |
|---|---|---|---|
| 2005/0176197 A1* | 8/2005 | Weis | H10B 12/0385 438/386 |
| 2009/0221123 A1* | 9/2009 | Griebenow | H01L 29/7848 257/E21.334 |
| 2022/0238526 A1* | 7/2022 | Wang | H10B 12/34 |

* cited by examiner

Primary Examiner — Hsien Ming Lee
(74) Attorney, Agent, or Firm — CKC & Partners Co., LLC

(57) ABSTRACT

A manufacturing method of a semiconductor device includes forming an opening in a substrate, implanting a dopant in the substrate from a sidewall of the opening such that a doping region is formed in the substrate at the sidewall of the opening, filling a dielectric material in the opening to form a first dielectric structure after implanting the dopant in the substrate from the sidewall of the opening, and forming a passing word line in the dielectric structure.

18 Claims, 13 Drawing Sheets

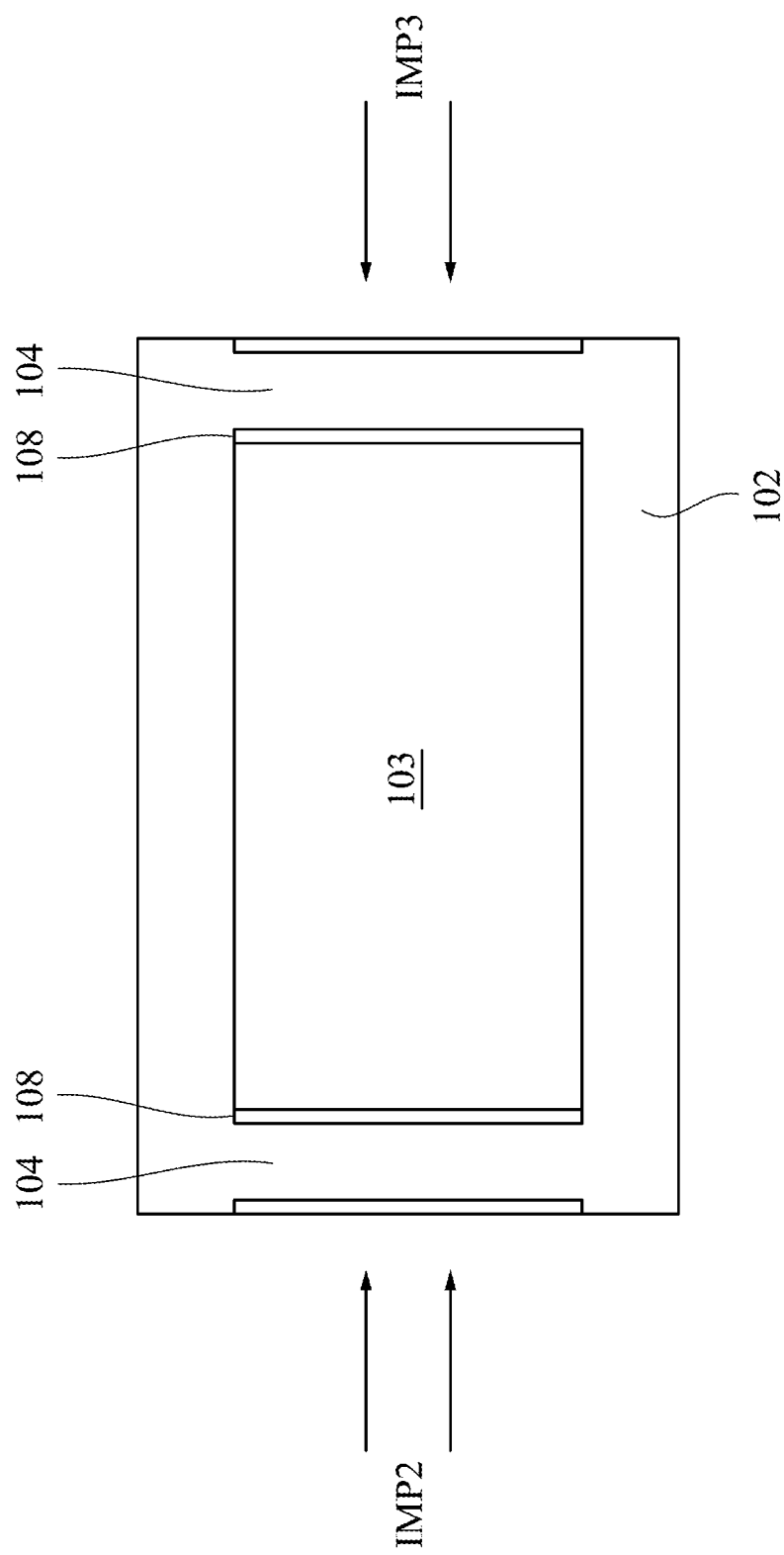

SEMICONDUCTOR DEVICE AND MANUFACTURING METHOD THEREOF

BACKGROUND

Field of Disclosure

The present disclosure relates to a semiconductor device and a manufacturing method thereof.

Description of Related Art

A variety of semiconductor memory devices are used extensively in many consumer products. Illustrative examples of such memory devices include dynamic random access memory (DRAM) and flash memory devices. As the semiconductor technology has progressed into nanoscale technology, the sizes of the semiconductor memory devices and the components therein are gradually reduced. The distance between adjacent elements, such as word lines, shrinks and leads to some adverse effects in semiconductor devices.

SUMMARY

In accordance with some embodiments of the present disclosure, a manufacturing method of a semiconductor device includes forming an opening in a substrate, implanting a dopant in the substrate from a sidewall of the opening such that a doping region is formed in the substrate at the sidewall of the opening, filling a dielectric material in the opening to form a first dielectric structure after implanting the dopant in the substrate from the sidewall of the opening, and forming a passing word line in the dielectric structure.

In accordance with some embodiments of the present disclosure, implanting the dopant in the substrate from the sidewall of the opening includes implanting the dopant at a bottom portion of the opening.

In accordance with some embodiments of the present disclosure, implanting the dopant in the substrate from the sidewall of the opening includes implanting the dopant in the substrate from the sidewall of the opening at a tilt angle with respect to a top surface of the substrate.

In accordance with some embodiments of the present disclosure, implanting the dopant in the substrate from the sidewall of the opening at the tilt angle includes implanting the dopant from a first side of the opening at a first tilt angle, and implanting the dopant from a second side of the opening at a second tilt angle, wherein the second side of the opening is opposite to the first side of the opening.

In accordance with some embodiments of the present disclosure, the tilt angle is in a range from 5° to 20°.

In accordance with some embodiments of the present disclosure, the dopant comprises a p-type dopant.

In accordance with some embodiments of the present disclosure, the method further includes performing an annealing process after implanting the dopant along the sidewall of the opening.

In accordance with some embodiments of the present disclosure, the method further includes forming a doped active region in the substrate before implanting the dopant in the substrate from the sidewall of the opening such that the doping region is partially formed in the doped active region.

In accordance with some embodiments of the present disclosure, a dose of the dopant for the doping region is lower than a dose of a dopant for forming the doped active region.

In accordance with some embodiments of the present disclosure, implanting the dopant in the substrate from the sidewall of the opening is performed at an implant energy in a range from about 1 keV to about 5 keV.

In accordance with some embodiments of the present disclosure, the methods further includes forming a second dielectric structure during forming the first dielectric structure, wherein the second dielectric structure is adjacent to the first structure and a size of the second dielectric structure is smaller than the first dielectric structure, and forming an active word line in the second dielectric layer during forming the passing word line.

In accordance with some embodiments of the present disclosure, the methods further includes forming a dielectric layer over the passing word line forming the passing word line in the dielectric structure.

In accordance with some embodiments of the present disclosure, a semiconductor device includes a substrate, a first dielectric structure, a passing word line, an active word line and a doping region. The substrate includes a doped active region. The first dielectric structure is in the substrate. The passing word line is in the first dielectric structure. The active word line is in the doped active region of the substrate and is adjacent to the passing word line. The doping region is in the substrate and at a sidewall of the first dielectric structure. The doping region is between the active word line and the first dielectric structure, and the doping region has a dopant concentration higher than a dopant concentration of the doped active region.

In accordance with some embodiments of the present disclosure, the doping region is at a bottom of the sidewall of the first dielectric structure.

In accordance with some embodiments of the present disclosure, the doped active region is at a top of the sidewall of the first dielectric structure.

In accordance with some embodiments of the present disclosure, the doping region and the doped active region have the same conductivity type.

In accordance with some embodiments of the present disclosure, the active word line is directly in contact with the substrate.

In accordance with some embodiments of the present disclosure, the semiconductor device further includes a second dielectric structure between the substrate and the active word line, and a size of the second dielectric structure is smaller than the first dielectric structure.

In accordance with some embodiments of the present disclosure, the doping region is separated from the second dielectric structure by the doped active region.

In accordance with some embodiments of the present disclosure, the doping region has a thickness extending from the sidewall of the first dielectric structure, and the thickness is in a range from about 1 nm to about 10 nm.

The doping region at the sidewall of the dielectric structure may reduce the probability of the passing word line turning on the threshold voltage, thereby reducing disturbance caused by the passing word line to the active word line adjacent to the passing word line. Moreover, the doping regions avoid the inversion layer from forming along the dielectric structure and extending to the substrate below. Hence, junction leakage during turning on the passing word lines may be reduced.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 1-4A and 5-9 illustrate cross section views of intermediate stages of a manufacturing method of a semiconductor device in accordance with some embodiments of the present disclosure.

FIG. 4B illustrates a top view of the intermediate stage of the manufacturing method of the semiconductor device along a line A-A in FIG. 4A.

DETAILED DESCRIPTION

Figure 1:
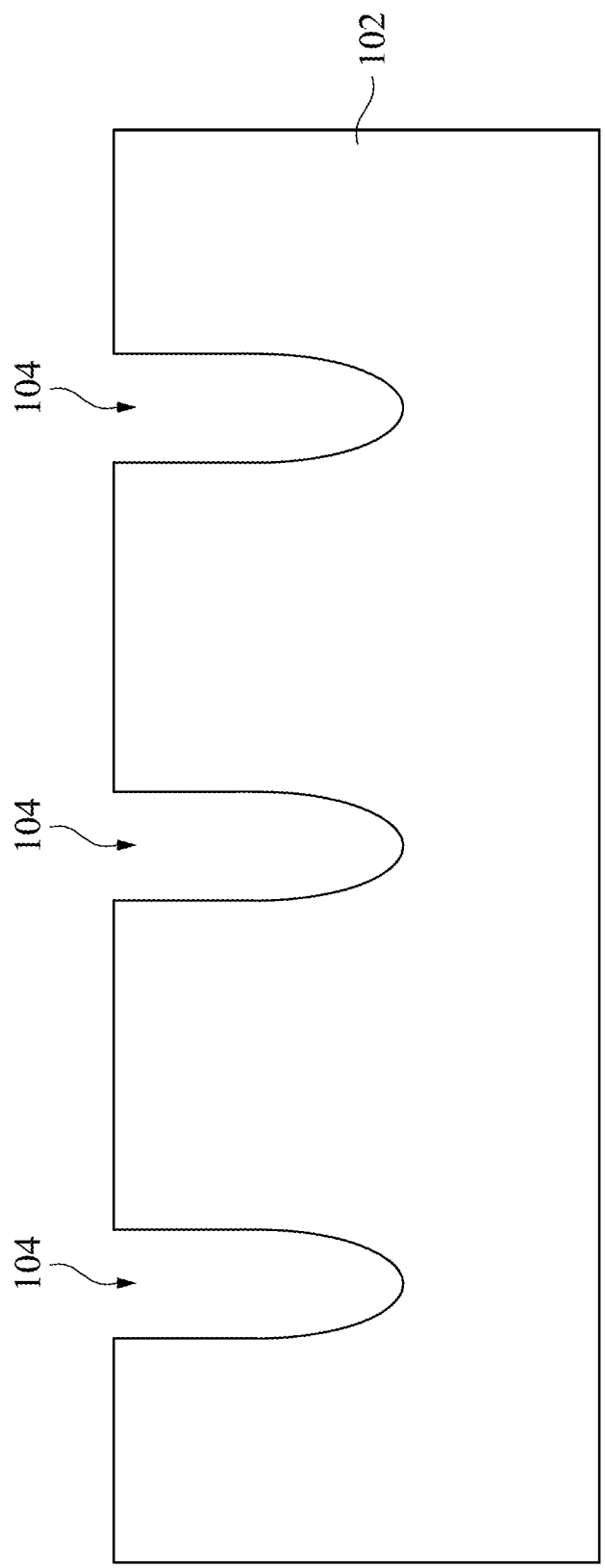

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure are related to forming a doping region along a sidewall of a dielectric structure surrounding a passing word line to avoid an inversion layer from forming along the dielectric structure and extending to a substrate below. Junction leakage during turning on the passing word line is reduced accordingly.

FIGS. 1-4A and 5-8 illustrate cross section views of intermediate stages of a manufacturing method of a semiconductor device in accordance with some embodiments of the present disclosure. Referring to FIG. 1, a substrate 102 is provided, and openings 104 are formed in the substrate 102 by using an etching process. The substrate 102 includes any suitable material, such as silicon. The etching process may include a selective wet etching process or a selective dry etching process. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include NH$_4$OH, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching). In some embodiments, a hard mask over the substrate 102 with a particular pattern is used to form openings 104. After forming the openings 104 in the substrate 102, the hard mask is still in place and may be removed in a suitable process.

Figure 2:
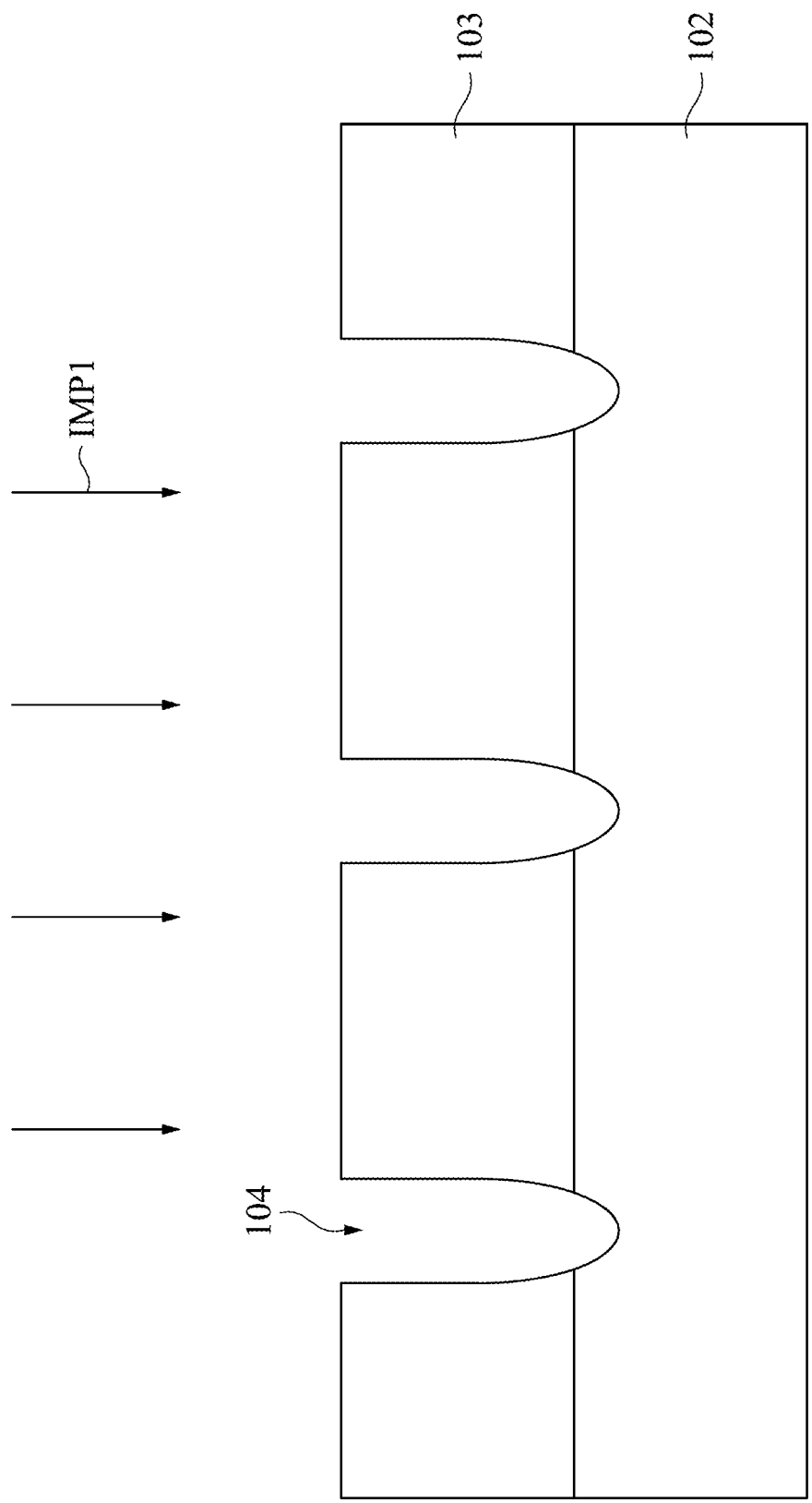

Referring to FIG. 2, a first implantation process IMP1 is performed on the substrate 102 to form a doped active region 103. The first implantation process IMP1 is evenly performed throughout the substrate 102 in a direction perpendicular to the top surface of the substrate 102. In some embodiments, the substrate 102 is doped by p-type dopants, such as boron, BF 2, or the like, in the first implantation process IMP1, and a dose of the first implantation process IMP1 is in a range from about $1\times10^{12}$/cm$^2$ to about $1\times10^{14}$/cm$^2$.

Figure 3:
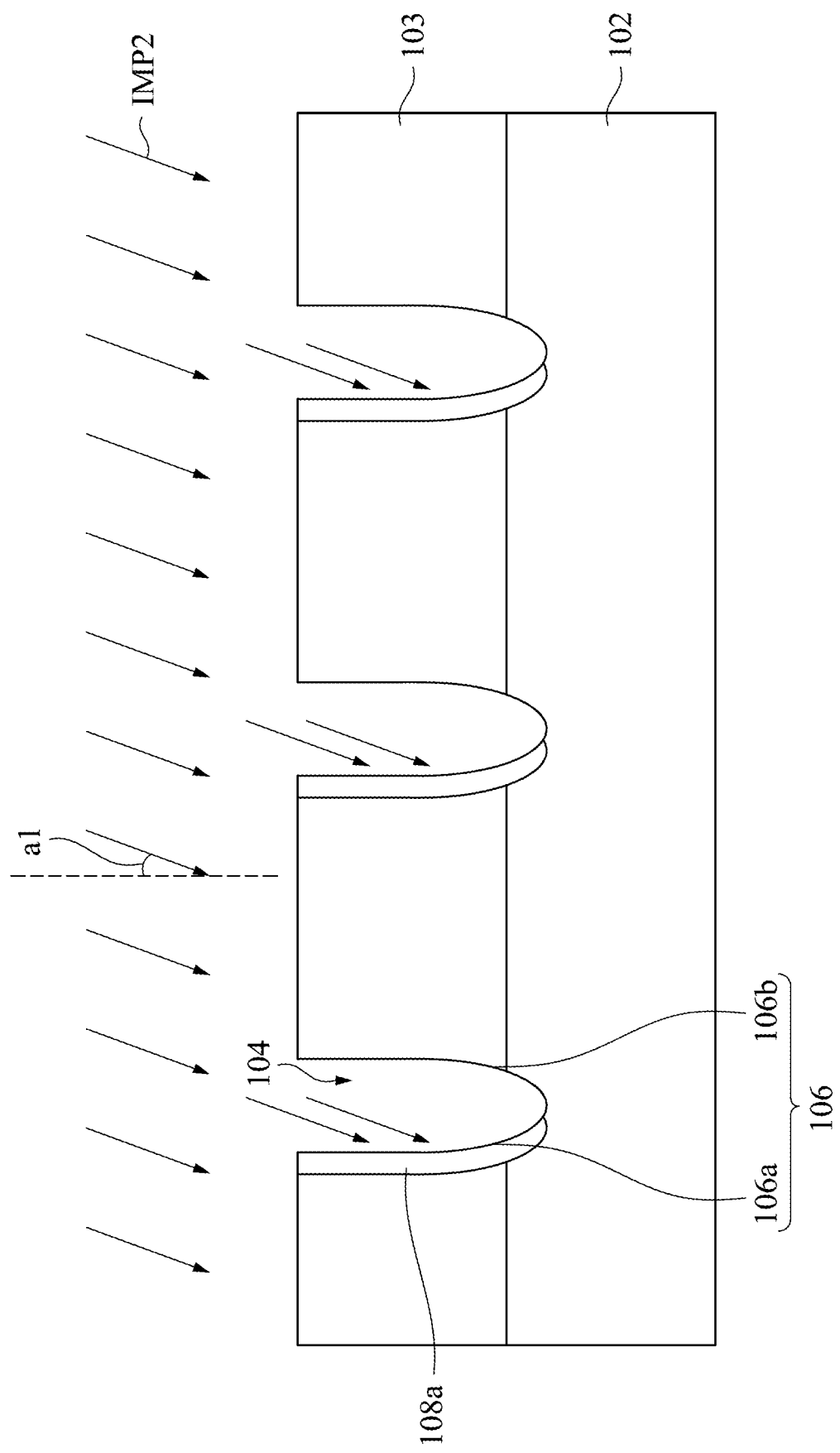
Figure 4A:
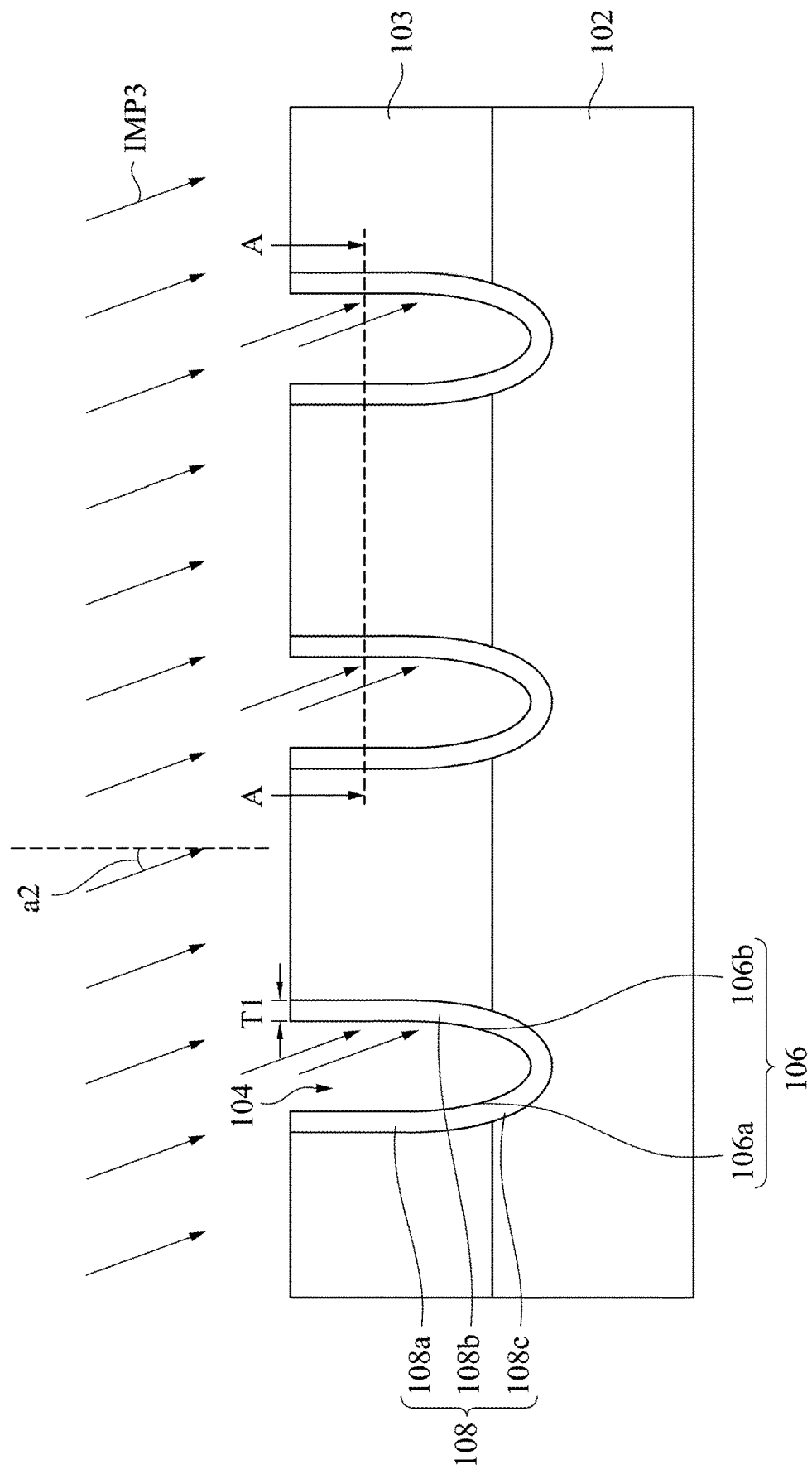

Referring to FIGS. 3 and 4A, after forming the openings 104 in the substrate 102 and performing the first implantation process IMP1, dopants are implanted in the substrate 102 at a tilt angle with respect to a top surface of the substrate 102 from sidewalls 106 of the openings 104 such that doping regions 108 are partially formed in the substrate 102 at the sidewalls 106 of the openings 104. Discussed in greater details, a second implantation process IMP2 in FIG. 3 is performed to implant the dopants from first sides 106a of the openings 104 at a first tilt angle a1 with respect to a top surface of the substrate 102, and a third implantation process IMP3 in FIG. 4A is performed to implant the dopants from second sides 106b of the openings 104 at a second tilt angle a2 with respect to the top surface of the substrate 102. The first side 106a and the second side 106b are opposite sides in the openings 104. Therefore, the first tilt angle a1 in the second implantation process IMP2 and the second tilt angle a2 in the third implantation process IMP3 are opposite angles.

After the second implantation process IMP2 and the third implantation process IMP3, doping regions 108a at the first sides 106a and doping regions 108b at the second sides 106b are partially formed in the doped active region 103 of the substrate 102. The doping region 108a at the first side 106a and doping region 108b at the second side 106b merge at the bottom of the opening 104 to form a doping region 108c at the bottom of the opening 104. The implantation parameters, such as dose, energy and angle, can be tuned based on different situations. In some embodiments, doses of the second implantation process IMP2 and the third implantation process IMP3 are in a range from about $1\times10^{12}$/cm$^2$ to about $1\times10^{13}$/cm$^2$ respectively and are lower than the dose of the first implantation process IMP1. Energy of the second implantation process IMP2 and the third implantation process IMP3 is in a range from about 1 keV to about 5 keV respectively. If the second implantation process IMP2 and the third implantation process IMP3 are performed under the condition disclosed above, the doping regions 108 are formed only at the surface of the openings 104. If the second implantation process IMP2 and the third implantation process IMP3 are performed out of the condition disclosed above, the doping regions 108 may be in contact with subsequently formed active word lines, which may cause adverse effect to the active word lines. In some embodiments, the first tilt angle a1 and the second tilt angle a2 are in a range from about 5° to about 20°. If the first tilt angle a1 and the second tilt angle 2 are out of the disclosed range, it may be hard to implant the dopants from the sidewalls 106 of the openings 104. In some embodiments, the doping region 108 has a thickness T1 extending from the sidewall 106 of the opening 104 and the subsequently formed dielectric structure (such as the first dielectric structure 112 in FIG. 6A), and the thickness T1 is in a range from about 1 nm to about 10 nm.

In some embodiments, the dopants in the second implantation process IMP2 and the third implantation process IMP3 are same as the dopants in the first implantation process IMP1, such as p-type dopants like boron, BF$_2$, or the like. Therefore, the doping regions 108 and the doped active region 103 has the same conductivity type, and the doping regions 108a (or 108b, 108c) are implanted twice in the first implantation process IMP1 and the second implantation process IMP2 (or the third implantation process IMP3), such that the dopant concentration of the doping regions 108a (or 108b, 108c) are higher than that of the doped active region 103.

The doping regions 108c at the bottom portion of the openings 104 reduce the probability of the subsequently formed passing word lines turning on the threshold voltage, thereby reducing disturbance caused by the subsequently formed passing word lines (such as the passing word lines 132 in FIG. 7) in the dielectric structures (such as the first dielectric structures 112 in FIG. 7) in the openings 104 to the subsequently formed active word lines (such as the active word lines 134 in FIG. 7). The doping regions 108a and 108b at the sides of the openings 104 may improve the isolation of the subsequently formed dielectric structures in the openings 104. In some embodiments, because the hard mask is still in place, the dopants are only implanted from the sidewalls 106 of the openings 104 and are not implanted from the top surface of the substrate 102.

FIG. 4B illustrates a top view of the semiconductor device in FIG. 4A, wherein FIG. 4B is the top view taken along a line A-A in FIG. 4A. In FIG. 4B, the direction of the second implantation process IMP2 and the third implantation process IMP3 are illustrated. It is noted that although both the second implantation process IMP2 and the third implantation process IMP3 are shown, it does not mean that the second implantation process IMP2 and the third implantation process IMP3 are performed at the same time. After the implantation processes, the doping regions 108 are formed adjacent to the openings 104 and are partially in the doped active region 103 from the top view.

Figure 5:
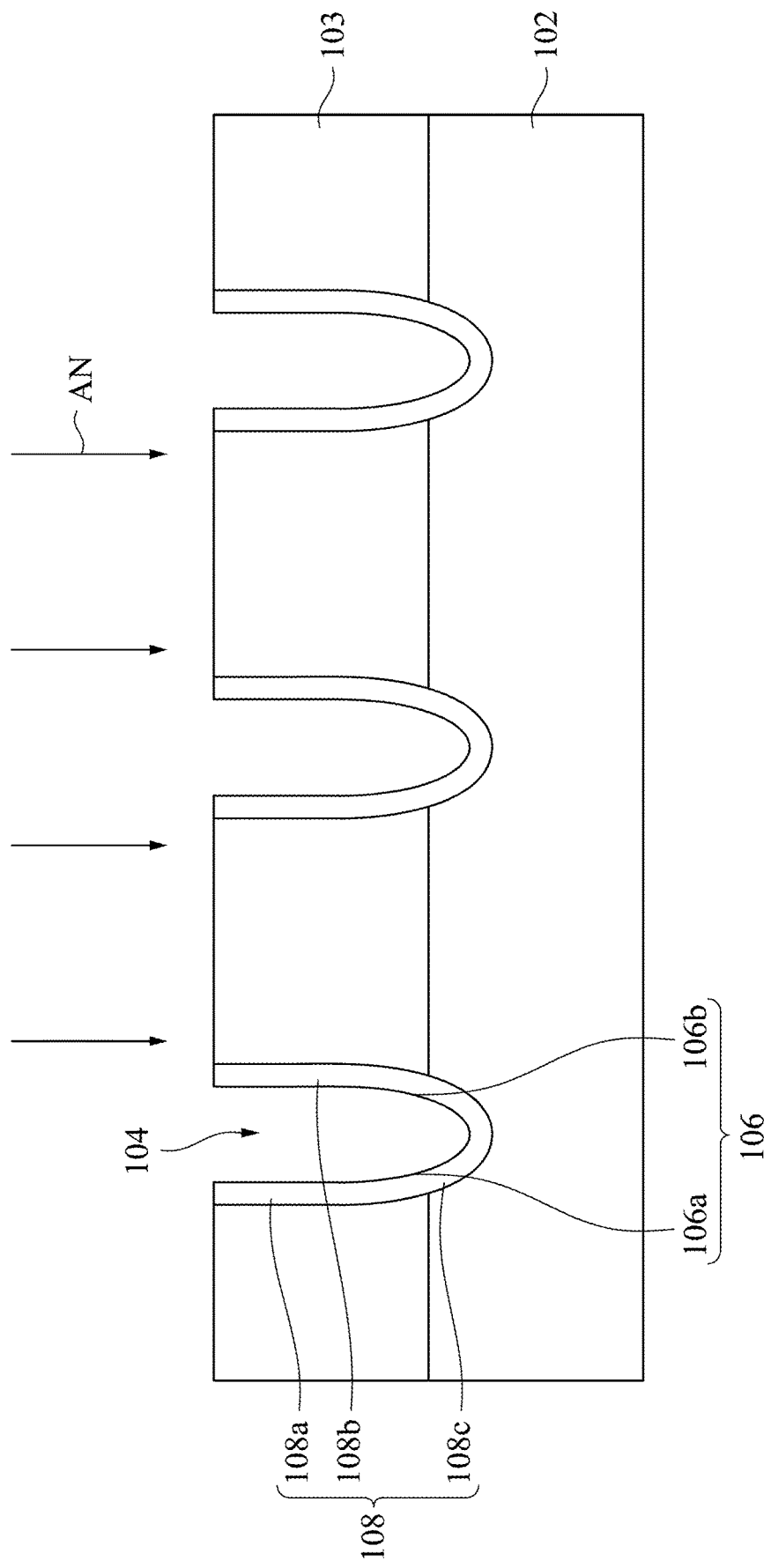

Referring to FIG. 5, after the third implantation process IMP3, an annealing process is performed to the doping regions 108a and 108b. The annealing process AN is controlled to prevent from the dopants in the doping regions 108a and 108b not moving too far from the surface of the openings 104, thereby obtaining the doping regions 108a and 108b near the surface of the openings 104. Internal stress in the doping regions 108a and 108b may also be reduced in the annealing process AN.

Figure 6:
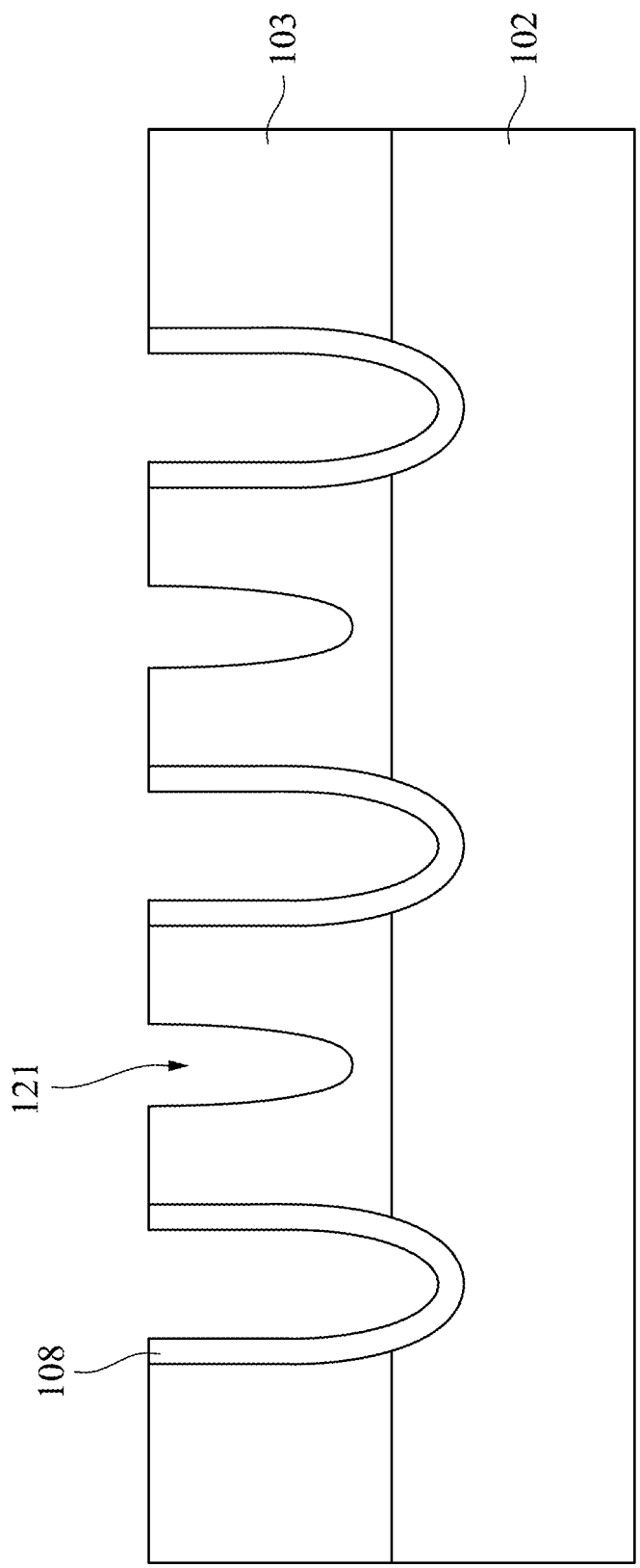

Referring to FIG. 6, dielectric materials are filled in the opening 104 to form first dielectric structures 112 and the second dielectric structures 122. Discussed in greater details, the openings 121 may be first formed after the annealing process AN in FIG. 5, and then the dielectric materials are filled in the openings 104 and the openings 121. In some embodiments, the openings 121 are formed between the openings 104 and the sizes of the openings 121 are smaller than the openings 104.

Figure 7:
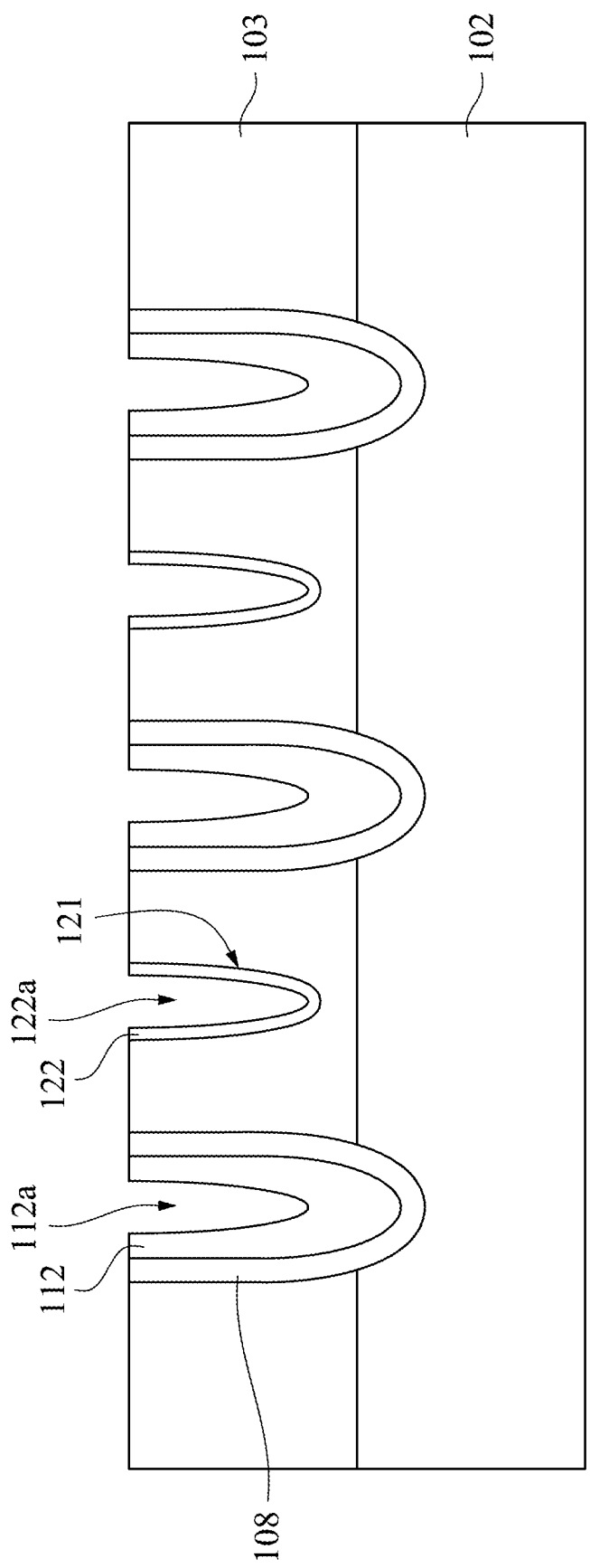

Referring to FIG. 7, the dielectric materials are first filled in the openings 104 and the openings 121, and then an etching process is performed to partially etch the dielectric materials. Accordingly, openings 112a and openings 122a are respectively formed in the dielectric material and the first dielectric structures 112 and the second dielectric structures 122 are formed. The second dielectric structures 122 are formed between the adjacent first dielectric structures 112. In some embodiments, the first dielectric structures 112 and the second dielectric structures 122 include one or more layers of a dielectric material, such as silicon oxide, titanium nitride, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the first dielectric structures 112 and the second dielectric structures 122 may be formed by CVD, atomic layer deposition (ALD) or any suitable method. In some embodiments, the etching process used to form the openings 112a and the openings 122a may be a selective wet etching or a selective dry etching. The difference between the first dielectric structures 112 and the second dielectric structures 122 is that the sizes of the second dielectric structures 122 are smaller than those of the first dielectric structures 112. For example, the second dielectric structures 122 may be conformal thin layers to the openings 121, and the first dielectric structures 112 are thicker layers, especially at the bottom portion of the openings 104.

The doping regions 108 are separated from the second dielectric structures 122 by the doped active region 103. Stated another way, the second dielectric structures 122 are not in contact with the doping regions 108. Although it is shown that there is only one second dielectric structure 122 between the adjacent first dielectric structures 112, the number of the second dielectric structures 122 between the adjacent first dielectric structures 112 is not limited, such as 2 or more.

Figure 8:
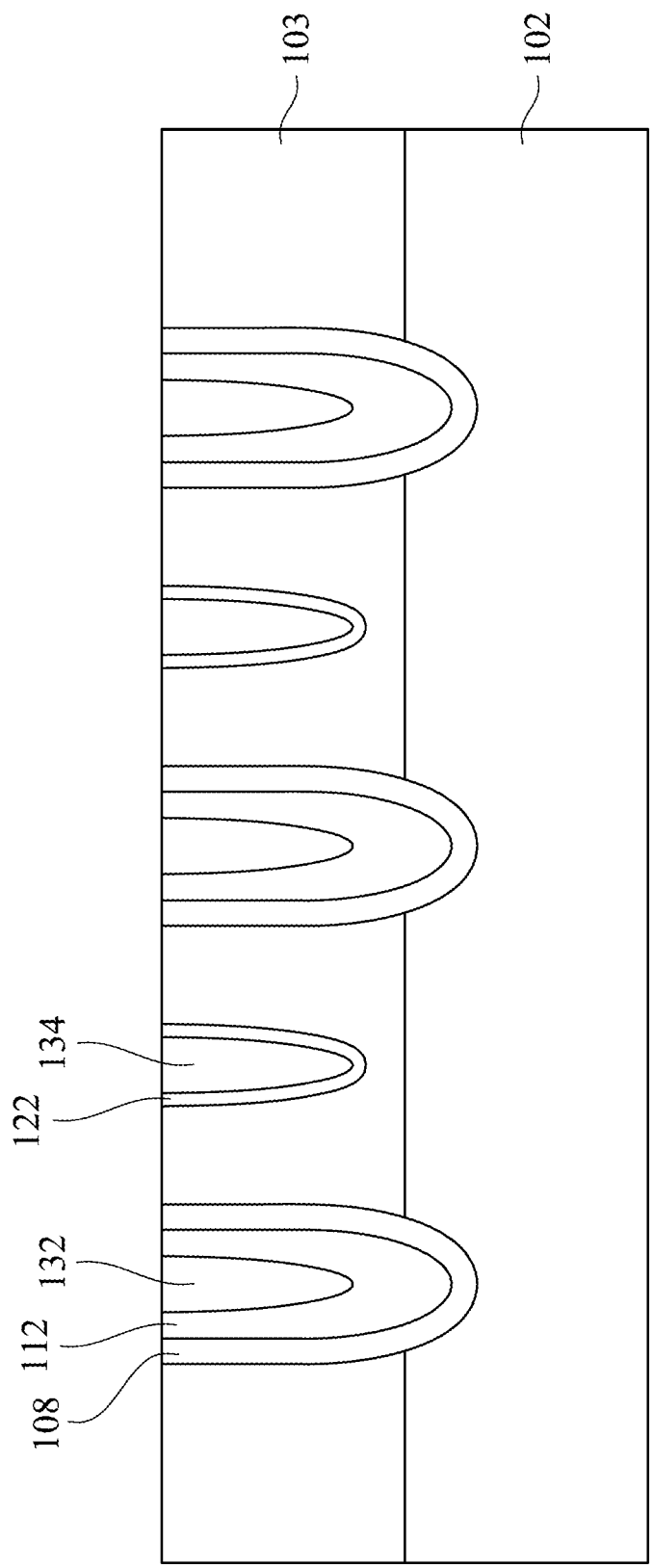

Referring to FIG. 8, passing word lines 132 are formed in the openings 112a of the first dielectric structures 112, and active word lines 134 are formed in the openings 122a of the second dielectric structures 122. Hence, the first dielectric structures 112 are formed between the substrate 102 and the passing word lines 132, and the second dielectric structures 122 are formed between the substrate 102 and the active word lines 134. In some embodiments, adhesion layers are formed in the openings 112a and 122a before forming the passing word lines 132 and the active word lines 134. The adhesion layers may respectively enable the passing word lines 132 and the active word lines 134 to have improved filling characteristics in the openings 112a and 122a, and therefore results in forming the passing word lines 132 and the active word lines 134 without leaving unfilled voids therein. In some embodiments, the adhesion layers may be made of titanium nitride (TiN).

In some embodiments, the method of forming the passing word lines 132 and the active word lines 134 may include filling an adhesion material and a conductive material in the openings 112a and 122a and then performing a planarization operation. In some embodiments, the passing word lines 132 and the active word lines 134 may be made of conductive materials such as tungsten, titanium nitride, polysilicon or other suitable conductive/semiconductive materials. In some embodiments, the passing word line 132 and the active word line 134 are made of different materials. In other embodiments, the passing word line 132 and the active word lines 134 are made of same materials.

Figure 9:
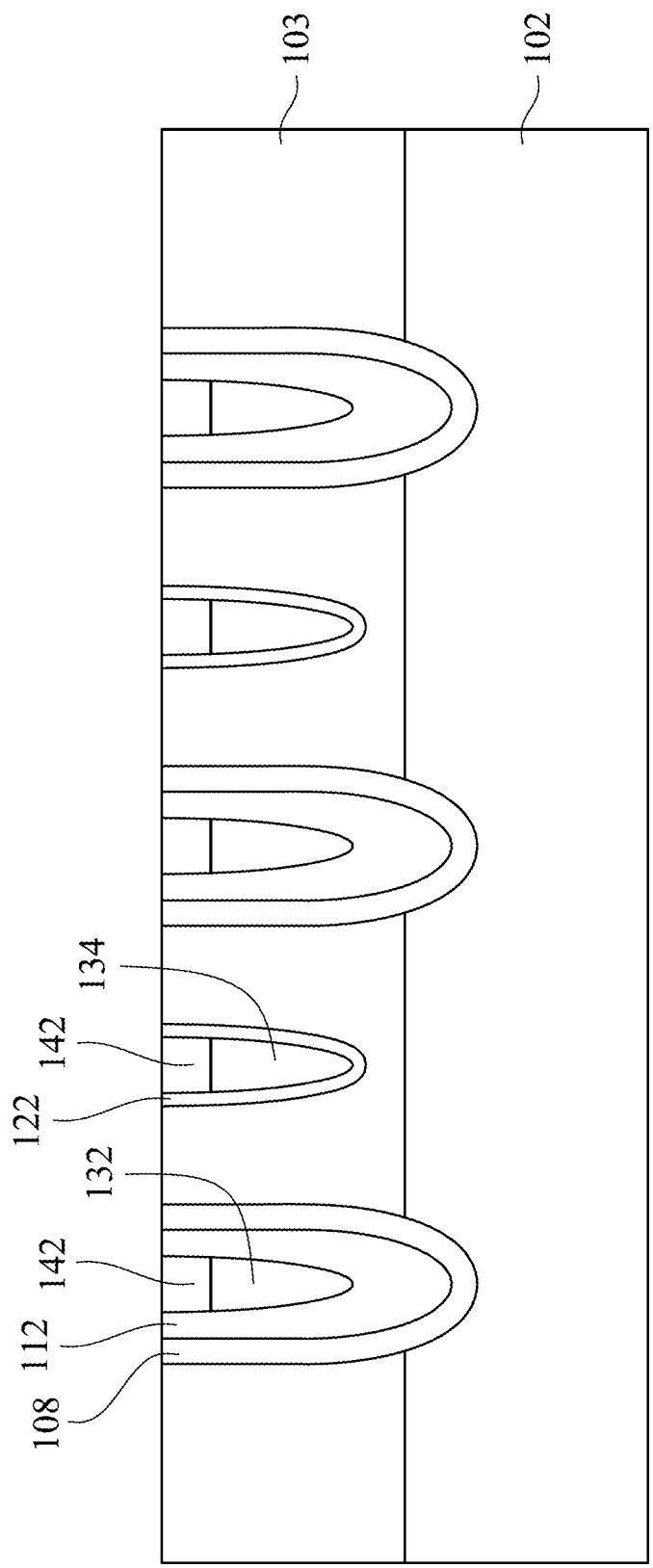

Referring to FIG. 9, dielectric layers 142 are formed over the passing word lines 132 and the active word lines 134 respectively. In some embodiments, the dielectric layers 142 are made of silicon nitride or other suitable dielectric materials. In some embodiments, the dielectric layers 142 are formed by chemical vapor deposition, ALD, or other suitable process.

In some embodiments, the method of forming the dielectric layers 142 may include performing a first planarization operation, such as a chemical mechanical polishing (CMP) method and/or an etch-back method, to remove a portion of the passing word lines 132 and the active word lines 134, forming the dielectric layers 142 to cover the passing word lines 132 and the active word lines 134, and performing a second planarization operation, which is similar to the first planarization operation, such that a portion of the dielectric layers 142 is removed. In other words, top surfaces of the first dielectric structures 112, top surfaces of the second dielectric structures 122 (if presented), and top surfaces of the dielectric layers 142 are at same horizontal level.

After forming the dielectric layers 142, the semiconductor device, as shown in FIG. 9, includes the substrate 102, the first dielectric structures 112, the passing word lines 132, the active word lines 134, and the doping regions 108. The substrate 102 includes the doped active region 103 therein. The first dielectric structures 112 are in the substrate 102, and the passing word lines 132 are in the first dielectric structures 112. The active word lines 134 are in the doped active region 103 of the substrate 102, and some active word lines 134 are adjacent to the passing word lines 132. The doping regions 108 are in the substrate 102 and at the sidewalls 106 of the first dielectric structures 112. The doping regions 108 are between the active word lines 134 and the first dielectric structures 112, and the doping regions 108 have a dopant concentration higher than a dopant concentration of the doped active region 103. In some embodiments, the semiconductor device has the second dielectric structures 122; therefore the active word lines 134 are in contact with the second dielectric structures 122, as shown in FIG. 9. In some other embodiments, the semiconductor device does not have the second dielectric structures 122; therefore the active word lines 134 are directly in contact with the substrate 102, as shown in FIG. 12 in later discussion.

The doping regions 108 reduce the probability of the passing word lines 132 turning on the threshold voltage, thereby reducing disturbance caused by the passing word lines 132 to the active word lines 134. The doping regions 108 avoid an inversion layer from forming along the first dielectric structures 112 and extending to the substrate 102 below. Hence, junction leakage during turning on the passing word lines 132 may be reduced.

Figure 10:
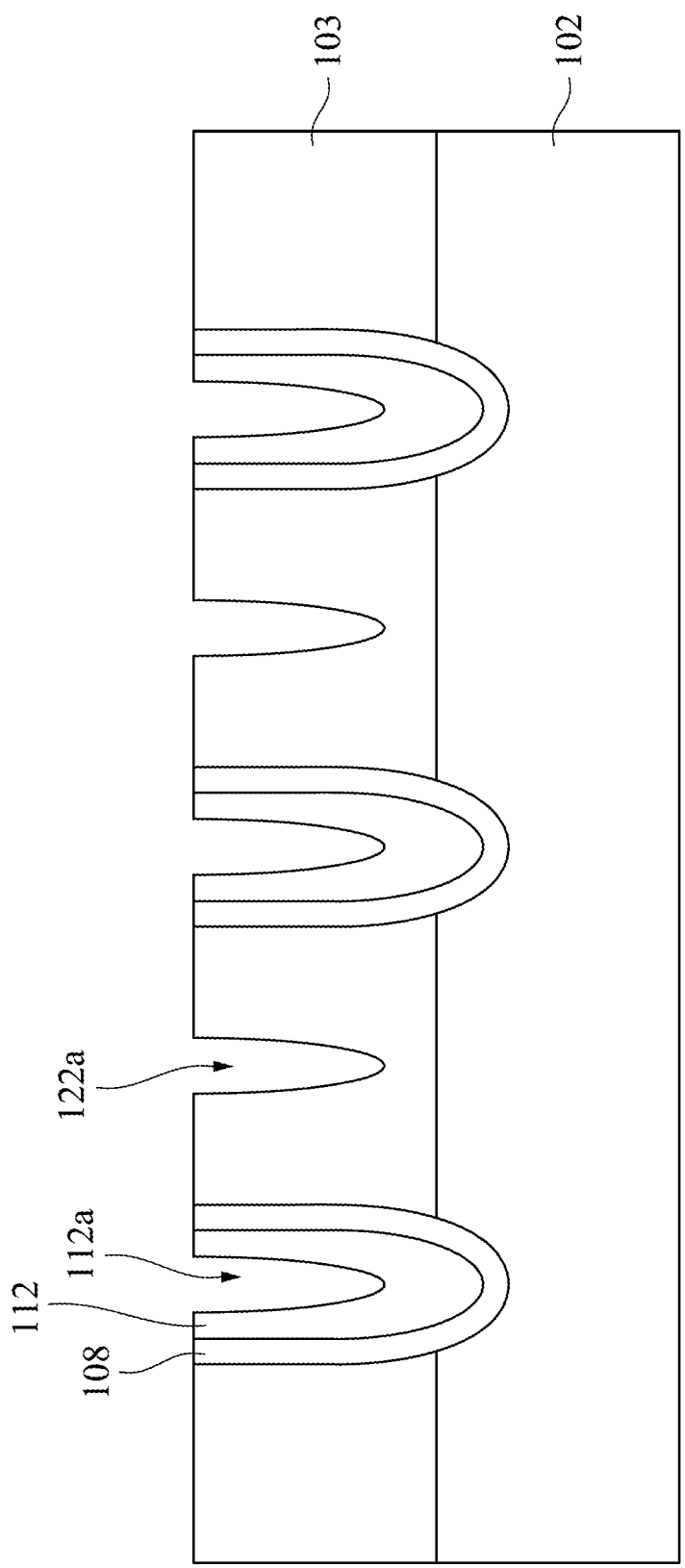
FIGS. 10-12 illustrate cross section views of intermediate stages of a manufacturing method of the semiconductor device in accordance with some other embodiments of the present disclosure.
Figure 11:
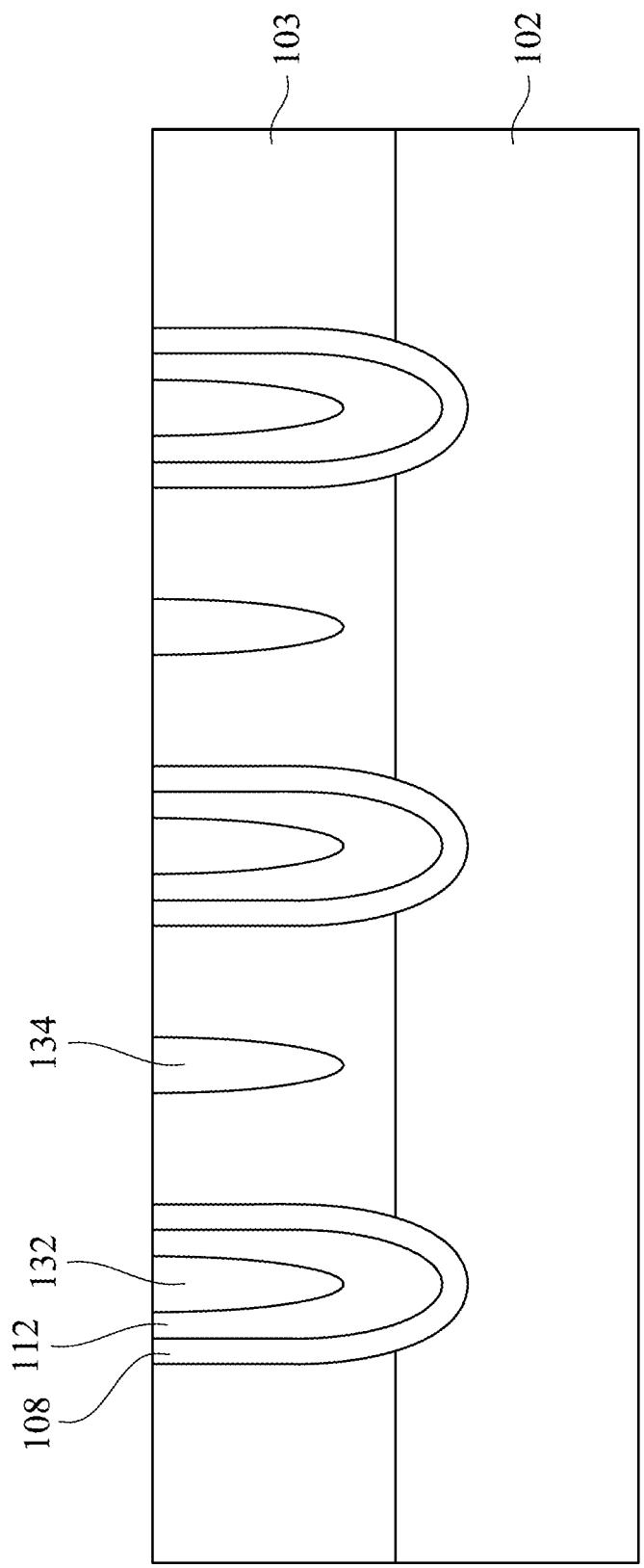
Figure 12:
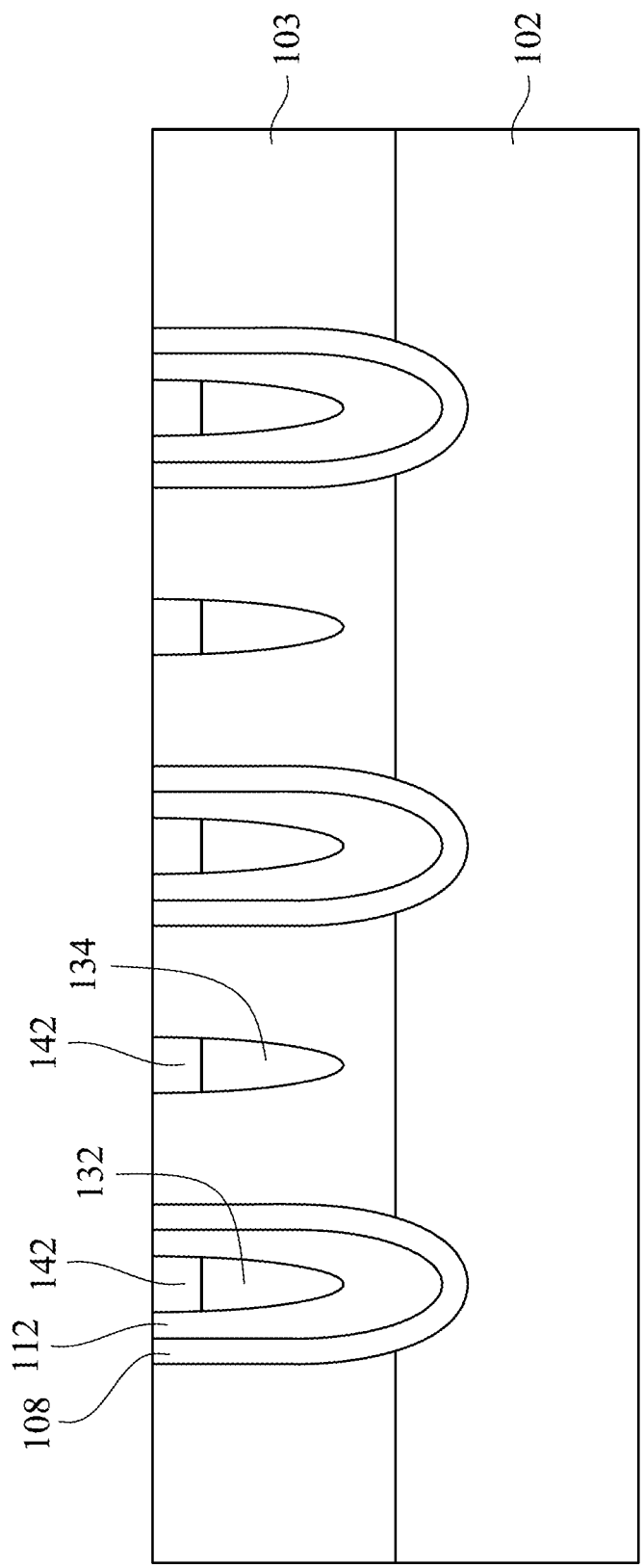

FIGS. 10-12 illustrate cross section views of intermediate stages of a manufacturing method of the semiconductor device in accordance with some other embodiments of the present disclosure. In FIGS. 10-12, the second dielectric structures 122 are not formed. After the annealing process AN in FIG. the dielectric materials are filled in the openings 104. Subsequently, the openings 112a are formed in the dielectric materials to form the first dielectric structures 112, and the openings 122a are directly formed in the substrate 102. The passing word lines 132 and the active word lines 134 are then respectively formed in the openings 112a and 122a. Other details related to FIGS. 10-12 are similar to the details related to FIGS. 6-8; therefore, detailed description is not described herein.

In summary, the doping region at the sidewall of the dielectric structure, in which a passing word line is in presence, may reduce the probability of the passing word line turning on the threshold voltage, thereby reducing disturbance caused by the passing word line to the active word line adjacent to the passing word line. Moreover, the doping regions avoid an inversion layer from forming along the dielectric structure and extending to the substrate below. Hence, junction leakage during turning on the passing word lines may be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a semiconductor device, comprising:
   forming an opening in a substrate;
   implanting a dopant in the substrate from a sidewall of the opening such that a doping region is formed in the substrate at the sidewall of the opening, wherein implanting the dopant in the substrate from the sidewall of the opening comprises implanting the dopant at a bottom portion of the opening;
   after implanting the dopant in the substrate from the sidewall of the opening, filling a dielectric material in the opening to form a first dielectric structure; and
   forming a passing word line in the first dielectric structure.

2. The method of claim 1, wherein implanting the dopant in the substrate from the sidewall of the opening comprises:
   implanting the dopant in the substrate from the sidewall of the opening at a tilt angle with respect to a top surface of the substrate.

3. The method of claim 2, wherein implanting the dopant in the substrate from the sidewall of the opening at the tilt angle comprises:
   implanting the dopant from a first side of the opening at a first tilt angle; and
   implanting the dopant from a second side of the opening at a second tilt angle, wherein the second side of the opening is opposite to the first side of the opening.

4. The method of claim 2, wherein the tilt angle is in a range from 5° to 20°.

5. The method of claim 1, wherein the dopant comprises a p-type dopant.

6. The method of claim 1, further comprising performing an annealing process after implanting the dopant along the sidewall of the opening.

7. The method of claim 1, further comprising forming a doped active region in the substrate before implanting the dopant in the substrate from the sidewall of the opening such that the doping region is partially formed in the doped active region.

8. The method of claim 7, wherein a dose of the dopant for the doping region is lower than a dose of a dopant for forming the doped active region.

9. The method of claim 1, wherein implanting the dopant in the substrate from the sidewall of the opening is performed at an implant energy in a range from about 1 keV to about 5 keV.

10. The method of claim 1, further comprising:
    forming a second dielectric structure during forming the first dielectric structure, wherein the second dielectric structure is adjacent to the first dielectric structure and a size of the second dielectric structure is smaller than the first dielectric structure; and
    forming an active word line in the second dielectric structure during forming the passing word line.

11. The method of claim 1, further comprising:
    forming a dielectric layer over the passing word line after forming the passing word line in the first dielectric structure.

12. A semiconductor device, comprising:
    a substrate comprising a doped active region;
    a first dielectric structure in the substrate;
    a passing word line in the first dielectric structure;

an active word line in the doped active region of the substrate and is adjacent to the passing word line; and a doping region in the substrate and at a bottom of a sidewall of the first dielectric structure, wherein the doping region is between the active word line and the first dielectric structure, and the doping region has a dopant concentration higher than a dopant concentration of the doped active region.

13. The semiconductor device of claim 12, wherein the doped active region is at a top of the sidewall of the first dielectric structure.

14. The semiconductor device of claim 12, wherein the doping region and the doped active region have the same conductivity type.

15. The semiconductor device of claim 12, wherein the active word line is directly in contact with the substrate.

16. The semiconductor device of claim 12, further comprising a second dielectric structure between the substrate and the active word line, wherein a size of the second dielectric structure is smaller than the first dielectric structure.

17. The semiconductor device of claim 16, wherein the doping region is separated from the second dielectric structure by the doped active region.

18. The semiconductor device of claim 12, wherein the doping region has a thickness extending from the sidewall of the first dielectric structure, and the thickness is in a range from about 1 nm to about 10 nm.

* * * * *